United States Patent
Ye

(10) Patent No.: US 10,840,380 B2
(45) Date of Patent: Nov. 17, 2020

(54) ACTIVE DEVICE SUBSTRATE AND MANUFACTURING METHOD THEREOF

(71) Applicant: Au Optronics Corporation, Hsinchu (TW)

(72) Inventor: Jia-Hong Ye, New Taipei (TW)

(73) Assignee: Au Optronics Corporation, Hsinchu (TW)

(*) Notice: Subject to any disclaimer, the term of this patent is extended or adjusted under 35 U.S.C. 154(b) by 0 days.

(21) Appl. No.: 16/388,887

(22) Filed: Apr. 19, 2019

(65) Prior Publication Data
US 2019/0326440 A1    Oct. 24, 2019

(30) Foreign Application Priority Data

Apr. 19, 2018    (TW) .............................. 107113414 A

(51) Int. Cl.
*H01L 29/10*    (2006.01)
*H01L 29/786*    (2006.01)
(Continued)

(52) U.S. Cl.
CPC .... *H01L 29/7869* (2013.01); *H01L 21/02164* (2013.01); *H01L 21/02271* (2013.01);
(Continued)

(58) Field of Classification Search
CPC ........... H01L 27/1274; H01L 21/02667; H01L 27/1214; H01L 27/1259; H01L 21/70; H01L 29/7869; H01L 21/02565; H01L 27/1225; H01L 27/1255; H01L 29/66969; H01L 27/1218; H01L 21/02422; H01L 21/02488; H01L 21/02672; H01L 27/1248; H01L 29/24; H01L 29/78696; H01L 21/02178; H01L 21/02244; H01L 21/02425; H01L 21/02592; H01L 21/02675; H01L 27/124; H01L 27/1251;
(Continued)

(56) References Cited

U.S. PATENT DOCUMENTS 8,829,511 B2    9/2014    Hsieh et al.
9,276,126 B2    3/2016    Miyamoto et al.
(Continued)

FOREIGN PATENT DOCUMENTS

CN    104538352    4/2015
CN    104094409    11/2016
(Continued)

*Primary Examiner* — Robert G Bachner
(74) *Attorney, Agent, or Firm* — JCIPRNET

(57) ABSTRACT

An active device substrate includes a substrate, a first active device, and a second active device. The first active device includes a first gate, a crystallized metal oxide layer, a first insulation layer, a first source, and a first drain. The crystallized metal oxide layer is located on the first gate. The first insulation layer is sandwiched between the crystallized metal oxide layer and the first gate. An area from the top surface of the crystallized metal oxide layer to the bottom surface of the crystallized metal oxide layer is observed via a selected area diffraction mode of a transmission electron microscope, and a diffraction pattern of a crystallized phase can be observed. The second active device includes a second gate, a silicon semiconductor layer, a second source, and a second drain. A manufacturing method of an active device substrate is further provided.

10 Claims, 16 Drawing Sheets

(51) Int. Cl.
*H01L 21/02* (2006.01)
*H01L 27/12* (2006.01)
*H01L 29/423* (2006.01)
*H01L 29/49* (2006.01)
*H01L 29/66* (2006.01)

(52) U.S. Cl.
CPC .. *H01L 21/02532* (2013.01); *H01L 21/02565* (2013.01); *H01L 21/02631* (2013.01); *H01L 21/02675* (2013.01); *H01L 27/1225* (2013.01); *H01L 27/1274* (2013.01); *H01L 29/42364* (2013.01); *H01L 29/42384* (2013.01); *H01L 29/4908* (2013.01); *H01L 29/66765* (2013.01); *H01L 29/66969* (2013.01); *H01L 29/78633* (2013.01); *H01L 29/78678* (2013.01)

(58) Field of Classification Search
CPC ......... H01L 29/42356; H01L 29/78603; H01L 29/78675; H01L 29/78678; H01L 29/66765; H01L 21/02164; H01L 21/02532; H01L 21/02554; H01L 21/02631; H01L 21/02686; H01L 2224/02235; H01L 2224/02255; H01L 2224/03013; H01L 2224/03614; H01L 2224/03622; H01L 2224/05027; H01L 2224/05073; H01L 2227/323; H01L 24/03; H01L 24/05; H01L 27/1262; H01L 27/3258; H01L 27/3276; H01L 29/045; H01L 29/41733; H01L 29/45; H01L 29/458; H01L 29/66757; H01L 21/022; H01L 21/02271; H01L 21/0228; H01L 27/1229; H01L 27/127; H01L 29/42364; H01L 29/42384; H01L 29/4908; H01L 29/78633; H01L 29/78648

See application file for complete search history.

(56) References Cited

U.S. PATENT DOCUMENTS

| | | |
|---|---|---|
| 9,577,111 B2 | 2/2017 | Ye |
| 9,647,010 B2 | 5/2017 | Endo |
| 2010/0123132 A1 | 5/2010 | Nakata et al. |
| 2012/0305910 A1 | 12/2012 | Hsieh et al. |
| 2014/0183528 A1 | 7/2014 | Endo |
| 2015/0041800 A1 | 2/2015 | Miyamoto et al. |
| 2017/0084458 A1 | 3/2017 | Ye |
| 2017/0236849 A1 | 8/2017 | Endo |
| 2018/0006157 A1 | 1/2018 | Ye |
| 2018/0166474 A1 | 6/2018 | Ye et al. |

FOREIGN PATENT DOCUMENTS

| | | |
|---|---|---|
| TW | 201251026 | 12/2012 |
| TW | 201431088 | 8/2014 |
| TW | I542715 | 7/2016 |
| TW | I611463 | 1/2018 |
| TW | I651848 | 2/2019 |

ACTIVE DEVICE SUBSTRATE AND MANUFACTURING METHOD THEREOF

CROSS-REFERENCE TO RELATED APPLICATION

This application claims the priority benefit of Taiwan application serial no. 107113414, filed on Apr. 19, 2018. The entirety of the above-mentioned patent application is hereby incorporated by reference herein and made a part of this specification.

BACKGROUND OF THE INVENTION

Field of the Invention

The invention relates to an active device substrate, and more particularly, to an active device substrate including a crystallized metal oxide layer and a manufacturing method thereof.

Description of Related Art

Currently, back-channel etch metal oxide thin-film transistors are gradually valued by many companies. Back-channel etch metal oxide thin-film transistors have advantages such as few lithography processes, miniaturized device, and low production cost, such that a display panel having greater aperture ratio can be manufactured.

In the manufacture of back-channel etch metal oxide thin-film transistors, a metal is formed on a metal oxide semiconductor channel layer, and then the metal is patterned to form a source and a drain separated from each other. However, when the metal is patterned, the metal oxide semiconductor channel layer is rather easily damaged from exposure to an etchant, such that product yield is reduced. Accordingly, a method that can solve the issue above is urgently needed.

SUMMARY OF THE INVENTION

The invention provides an active device substrate that can reduce damage to metal oxide by an etchant during the patterning process of a source and a drain.

The invention provides a manufacturing method of an active device substrate that can reduce damage to metal oxide by an etchant during the manufacture of a source and a drain.

An active device substrate of the invention includes a substrate, a first active device, and a second active device. The first active device includes a first gate, a crystallized metal oxide layer, a first insulation layer, a first source, and a first drain. The crystallized metal oxide layer is located on the first gate, and a first insulation layer is sandwiched between the crystallized metal oxide layer and the first gate. An area from the top surface of the crystallized metal oxide layer to the bottom surface of the crystallized metal oxide layer is observed via a selected area diffraction mode of a transmission electron microscope, and a diffraction pattern of a crystallized phase can be observed. The first source and the first drain are electrically connected to the crystallized metal oxide layer. The second active device includes a second gate, a silicon semiconductor layer, a second source, and a second drain. The silicon semiconductor layer is overlapped with the second gate. The second source and the second drain are electrically connected to the silicon semiconductor layer.

The manufacturing method of an active device substrate of the invention includes the following. A first gate is formed on a substrate. A first insulation layer is formed on the first gate. A non-crystallized metal oxide layer is formed on the first gate. A second insulation layer is formed on the non-crystallized metal oxide layer. A non-crystallized silicon layer is formed on the second insulation layer, and the non-crystallized metal oxide layer is located between the non-crystallized silicon layer and the first gate. A rapid thermal annealing process is performed to transform the non-crystallized metal oxide layer into a crystallized metal oxide layer. A first source and a first drain electrically connected to the crystallized metal oxide layer are formed.

Based on the above, in at least one embodiment of the invention, the active device substrate metal oxide layer includes a crystallized phase, and damage to metal oxide by an etchant in the manufacture of the source and the drain can be reduced. Moreover, the non-crystallized metal oxide layer of the invention can be transformed into a crystallized metal oxide layer without excimer laser annealing (ELA), such that the cost and time needed for the manufacture of the active device substrate can be reduced.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1D are cross sections of a manufacturing process of an active device substrate 1 according to an embodiment of the invention.

Figure 1A:
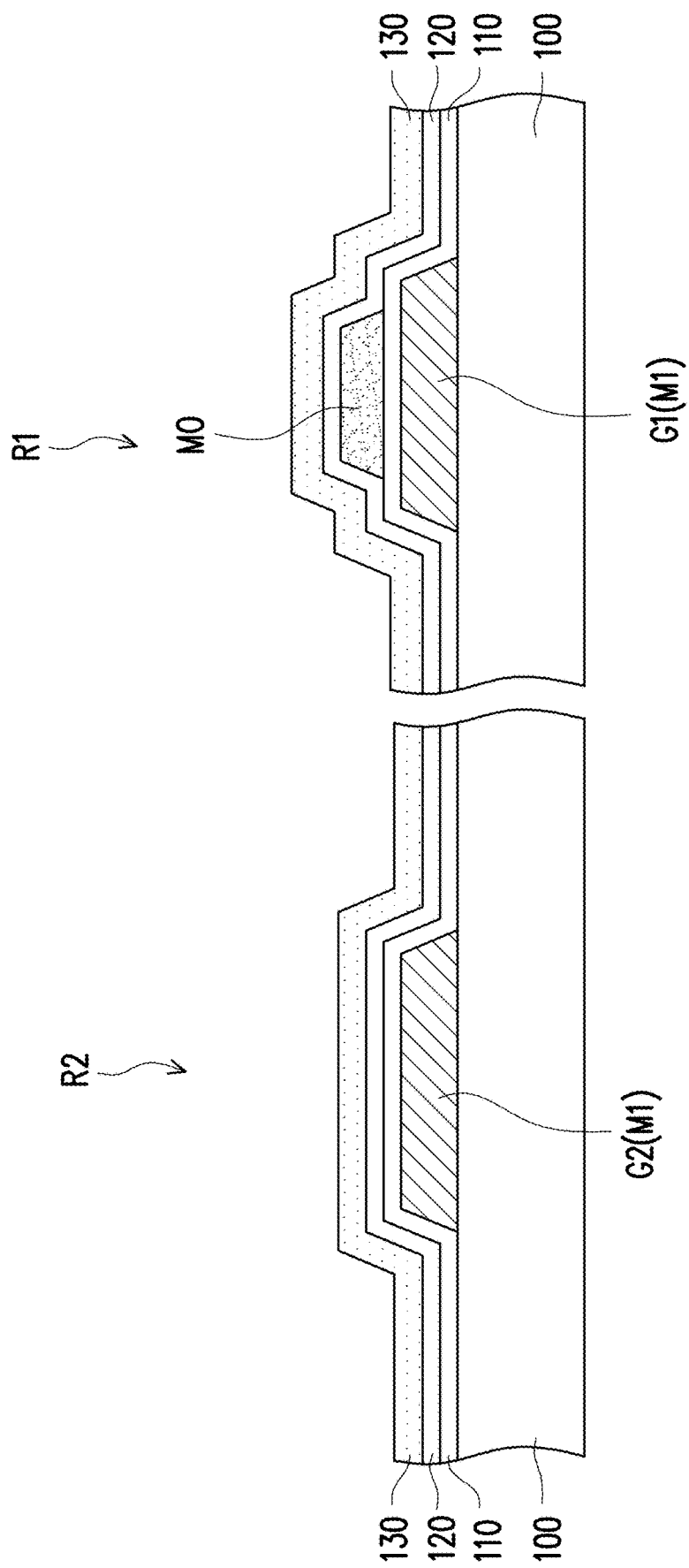
FIG. 1A to FIG. 1D are cross sections of a manufacturing process of an active device substrate according to an embodiment of the invention.

Referring first to FIG. 1A, a patterned first conductive material layer M1, a first insulation layer 110, a non-crystallized metal oxide layer MO, a second insulation layer 120, and a non-crystallized silicon layer 130 are formed on a substrate 100 in order.

The patterned first conductive material layer M1 includes, for instance, a first gate G1 and a second gate G2, and the first gate G1 and the second gate G2 are respectively located in a first region R1 and a second region R2 on the substrate 100. In some embodiments, the active device substrate 1 is a pixel array substrate, and the first region R1 and the second region R2 on the substrate 100 are respectively a display region and a peripheral region, but the invention is not limited thereto.

In some embodiments, the first gate G1 and the second gate G2 include a metal such as titanium, gold, molybdenum, copper, aluminum, silver, other metals, or a combination of the metals. In some embodiments, the first gate G1 and the second gate G2 include a multilayer structure such as a titanium-aluminum-titanium structure or a molybdenum-aluminum-molybdenum structure, but the invention is not limited thereto. In some embodiments, the first gate G1 and the second gate G2 are preferably titanium or a combination of titanium and aluminum. In some embodiments, the thickness of the first gate G1 and the second gate G2 is preferably 0.1 microns to 1 micron, but the invention is not limited thereto. In some embodiments, the method of forming the first gate G1 and the second gate G2 includes physical vapor deposition (PVD) or other similar processes. In some embodiments, the first gate G1 and the second gate G2 are formed together.

The first insulation layer 110 is formed on the first gate G1. In some embodiments, the first insulation layer 110 covers the first gate G1, the second gate G2, and a portion of the substrate 100. The first insulation layer 110 includes, for instance, silicon oxide. The thickness of the first insulation layer 110 is preferably 50 nm to 300 nm such as 100 nm, 150 nm, 200 nm, or 250 nm. Within this range, the first insulation layer 110 can obtain better insulation and heat transfer effects. In some embodiments, the method of forming the first insulation layer 110 includes chemical vapor deposition (CVD) or other similar processes.

The non-crystallized metal oxide layer MO is formed on the first gate G1 in the first region R1, and the non-crystallized metal oxide layer MO at least covers a portion of the top surface of the first gate G1. In some embodiments, the non-crystallized metal oxide layer MO further covers a portion of a side surface of the first gate G1. In some embodiments, the non-crystallized metal oxide layer MO is further formed on the second gate G2 in the second region R2. The metal element of the non-crystallized metal oxide layer MO includes, for instance, an indium element, a gallium element, a zinc element, or a combination of the metal elements. The non-crystallized metal oxide layer MO is, for instance, formed via a sputtering method at room temperature, but the invention is not limited thereto. In some embodiments, the thickness of the non-crystallized metal oxide layer MO is 40 nm to 100 nm such as 50 nm, 60 nm, 70 nm, 80 nm, or 90 nm.

The second insulation layer 120 is formed on the non-crystallized metal oxide layer MO, and the non-crystallized metal oxide layer MO is located between the first insulation layer 110 and the second insulation layer 120. In some embodiments, the second insulation layer 120 covers the first gate G1, the second gate G2, and a portion of the substrate 100. The second insulation layer 120 includes, for instance, silicon oxide. The thickness of the second insulation layer 120 is preferably 50 nm to 250 nm such as 100 nm, 150 nm, or 200 nm. Within this range, the second insulation layer 120 can obtain better insulation and heat transfer effects. In some embodiments, the method of forming the second insulation layer 120 includes chemical vapor deposition (CVD) or other similar processes.

The non-crystallized silicon layer 130 is formed on the second insulation layer 120, and the non-crystallized metal oxide layer MO is located between the non-crystallized silicon layer 130 and the first gate G1. The thickness of the non-crystallized silicon layer 130 is 10 nm to 230 nm, preferably 40 nm to 60 nm, such as 50 nm. In some embodiments, the method of forming the non-crystallized silicon layer 130 includes chemical vapor deposition (CVD) or other similar processes. In some embodiments, the non-crystallized silicon layer 130 includes an n-type doped semiconductor and a resistance between the non-crystallized silicon layer 130 and other conductive layer may be reduced. The n-type doped semiconductor may be deposited on the second insulation layer 120.

Figure 1B:
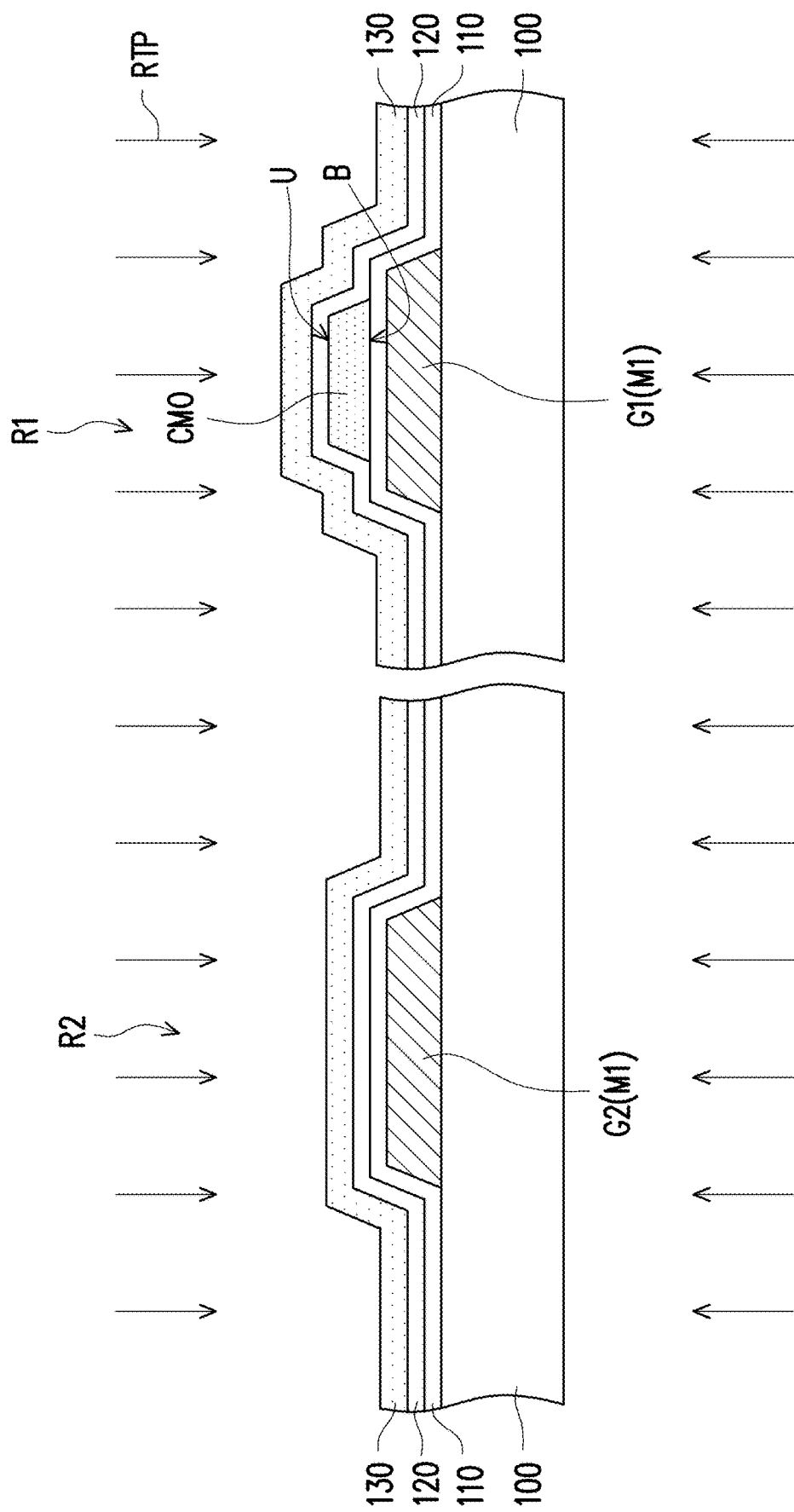

Referring to FIG. 1B, a rapid thermal annealing process RTP is performed to transform the non-crystallized metal oxide layer MO into a crystallized metal oxide layer CMO. In some embodiments, the rapid thermal annealing process RTP has a maximum temperature of 400 degrees to 700 degrees, such as 625 degrees, 650 degrees, or 675 degrees and a duration of 30 seconds to 6 minutes.

In prior art, excimer laser annealing (ELA) is further performed after the rapid thermal annealing process to provide heat in order to crystallize a semiconductor (such as non-crystallized metal oxide or non-crystallized silicon), but in the invention, the non-crystallized metal oxide layer MO can be transformed into the crystallized metal oxide layer CMO directly in the rapid thermal annealing process, and therefore the cost and time of manufacturing the active device substrate are reduced. In some embodiments, the crystallized metal oxide layer CMO includes a plurality of crystals having crystal axes that are not parallel to one another, but the invention is not limited thereto. An area from a top surface U of the crystallized metal oxide layer CMO to a bottom surface B of the crystallized metal oxide layer CMO is observed via a selected area diffraction mode of a transmission electron microscope, and a diffraction pattern of a crystallized phase can be observed. In some embodiments, the crystallized metal oxide CMO includes indium gallium zinc oxide, and if indium gallium zinc oxide is used as a channel layer of a thin-film transistor, then a thinner gate insulation layer can be formed, and the advantage of higher carrier mobility can be achieved.

Figure 1C:
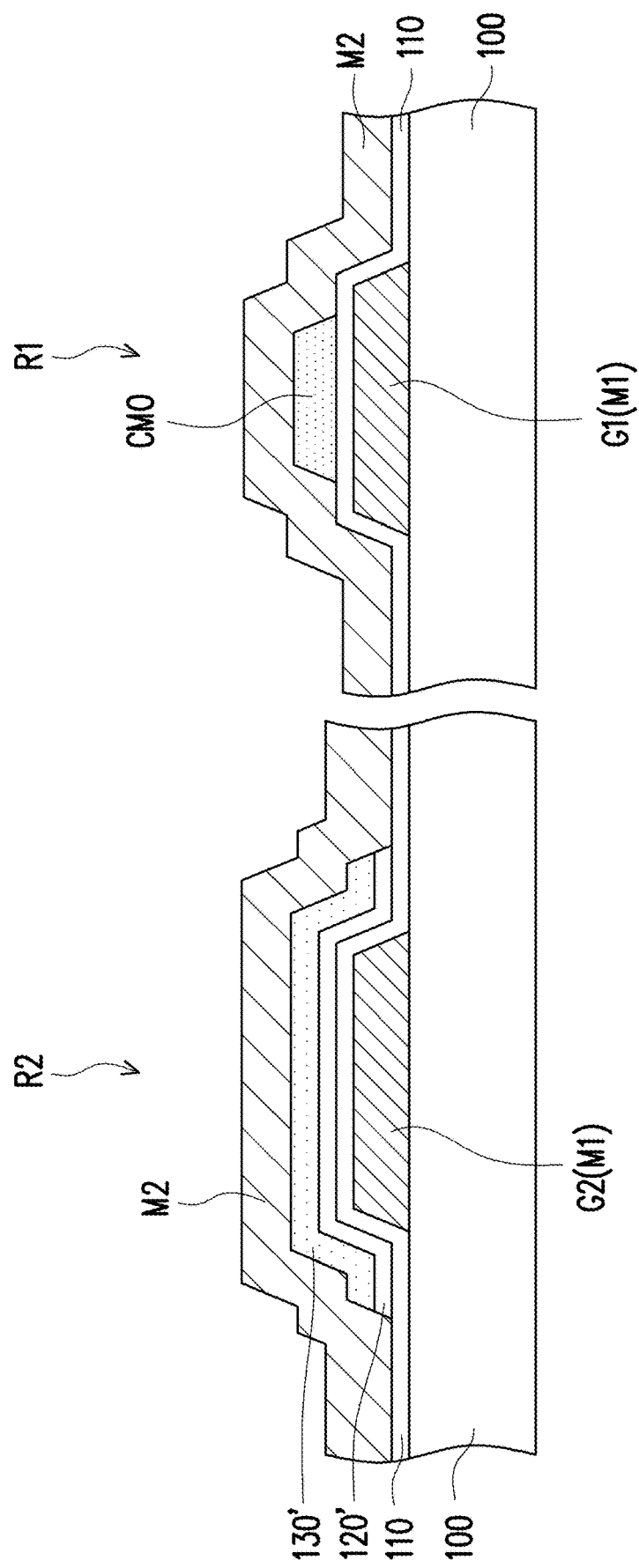

Referring to FIG. 1C, a portion of the non-crystallized silicon layer 130 located in the first region R1 is removed, and the remaining non-crystallized silicon layer 130 includes a silicon semiconductor layer 130'. The silicon semiconductor layer 130' at least covers a portion of the second gate G2. In the present embodiment, a portion of the second insulation layer 120 is also removed, a portion of the first insulation layer 110 and the remaining second insulation layer 120' is located between the silicon semiconductor layer 130' and the second gate G2, and a portion of the first insulation layer 110 is located between the second insulation layer 120' and the second gate G2.

A second conductive material layer M2 is formed on the substrate 100, and the second conductive material layer M2 covers, for instance, the crystallized metal oxide layer CMO, the silicon semiconductor layer 130', the first insulation layer 110, and the second insulation layer 120'. The second conductive material layer M2 includes, for instance, titanium, gold, molybdenum, copper, aluminum, silver, other metals, or a combination of the metals. In some embodiments, the second conductive material layer M2 includes a multilayer structure such as a titanium-aluminum-titanium structure or a molybdenum-aluminum-molybdenum structure, but the invention is not limited thereto. In some embodiments, the second conductive material layer M2 is preferably molybdenum or a combination of molybdenum and aluminum, but the invention is not limited thereto. In some embodiments, the method of forming the second conductive material layer M2 includes physical vapor deposition (PVD) or other similar processes.

In some embodiments, before the second conductive material layer M2 is formed, an etch-stop layer is formed on the crystallized metal oxide layer CMO to protect the crystallized metal oxide layer CMO when the second conductive material layer M2 is subsequently patterned.

Figure 1D:
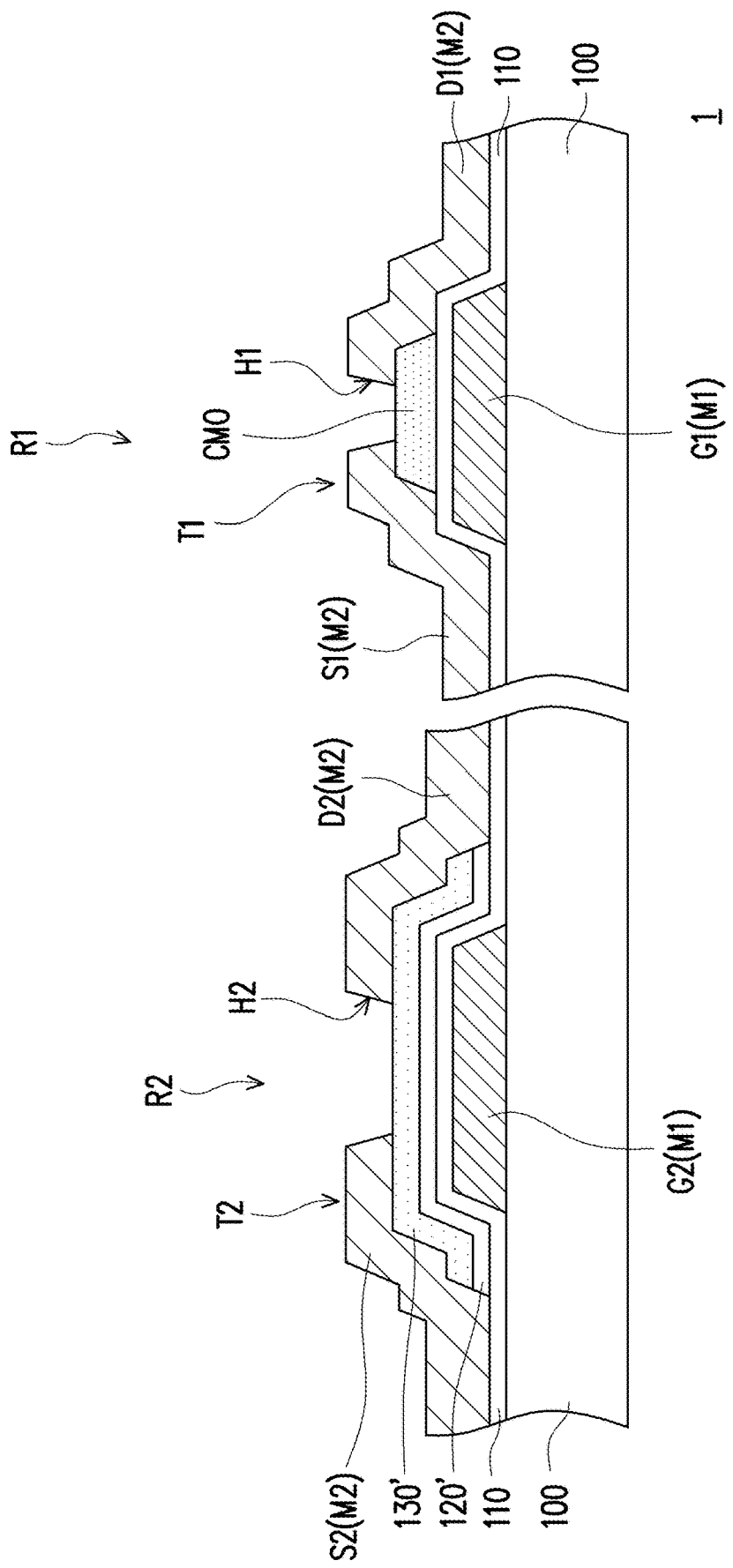

Referring to FIG. 1D, a patterning process is performed on the second conductive material layer M2 to form a first source S1, a first drain D1, a second source S2, and a second drain D2. The first source S1 and the first drain D1 are electrically connected to the crystallized metal oxide layer CMO. The second source S2 and the second drain D2 are electrically connected to the silicon semiconductor layer 130'.

The method of patterning the second conductive material layer M2 includes, for instance, forming an opening H1 and an opening H2 in the second conductive material layer M2 using a wet etching method. The opening H1 separates the first source S1 and the first drain D1, and the opening H2 separates the second source S2 and the second drain D2. In some embodiments, the crystallized metal oxide layer CMO has better anti-etching capability than the non-crystallized metal oxide layer MO, and therefore damage to the crystallized metal oxide layer CMO by an etchant during the patterning of the second conductive material layer M2 can be reduced. In some embodiments, the patterning of the second conductive material layer M2 adopts oxalic acid, aluminum acid, hydrofluoric acid, or other similar etchants. In some embodiments, the second conductive material layer M2 adopts a molybdenum-aluminum-molybdenum multilayer structure having lower resistance and lower production cost, and an aluminum acid etchant can be used in the patterning of the second conductive material layer M2 to further reduce the production cost. In the present embodiment, patterning the second conductive material layer M2 using a wet etching method has the advantages of rapid production and low cost.

At this point, the active device substrate 1 of the present embodiment is largely complete, and the active device substrate 1 includes a substrate 100, a first active device T1, and a second active device T2. The first active device T1 includes a first gate G1, a crystallized metal oxide layer CMO, a first insulation layer 110, a first source S1, and a first drain D1. The crystallized metal oxide layer CMO is located on the first gate G1, and a first insulation layer 110 is sandwiched between the crystallized metal oxide layer CMO and the first gate G1. The first source S1 and the first drain D1 are electrically connected to the crystallized metal oxide layer CMO. The second active device T2 includes a second gate G2, a silicon semiconductor layer 130', a second source S2, and a second drain D2. A portion of the first insulation layer 110 and the second insulation layer 120' are sandwiched between the second gate G2 and the silicon semiconductor layer 130'.

In the present embodiment, the first drain D1 of the first active device T1 is electrically connected to a pixel electrode, and the second active device T2 is, for instance, a gate driver device in a gate-on-array (GOA). The crystallized metal oxide layer CMO of the first active device T1 has lower leakage current, and the silicon semiconductor layer 130' of the second active device T2 includes amorphous silicon, and therefore the active device substrate 1 of the present embodiment has advantages such as power saving and lower production cost at the same time. Moreover, using the second active device T2 including amorphous silicon as the gate driver device of the GOA can achieve higher device reliability. Moreover, the first active device T1 in the present embodiment is a back channel-etched thin film transistor, and therefore the active device substrate 1 has a higher aperture ratio.

Figure 2:
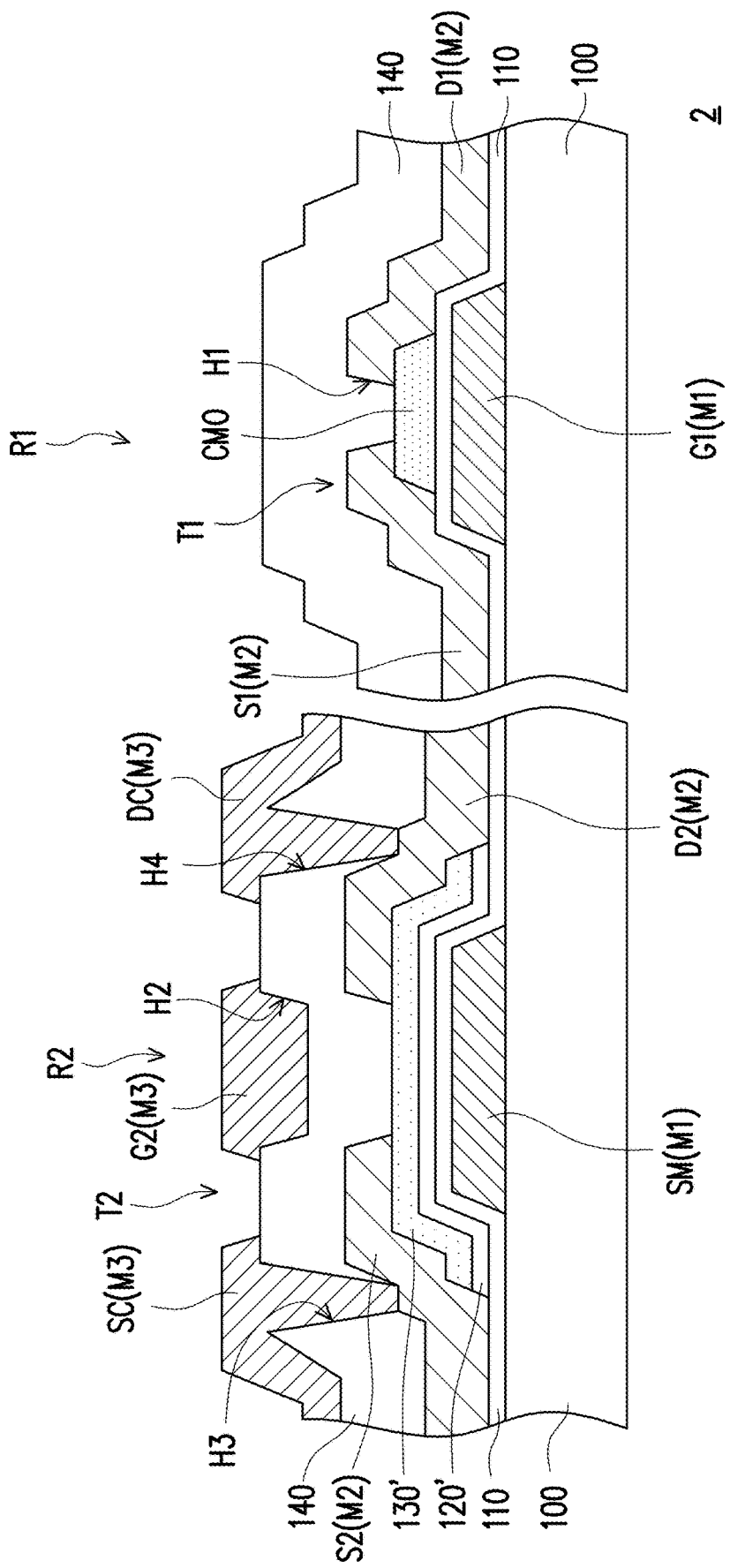
FIG. 2 is a cross section of a manufacturing process of an active device substrate according to an embodiment of the invention.

FIG. 2 is a cross section of a manufacturing process of an active device substrate 2 according to an embodiment of the invention. It should be mentioned here that, the embodiment of FIG. 2 adopts the reference numerals of the embodiment of FIG. 1A to FIG. 1D and a portion of the contents thereof, wherein the same or similar numerals are used to represent the same or similar devices and descriptions of the same technical contents are omitted. The omitted portions are as described in the above embodiments and are not repeated herein.

Referring to FIG. 2, in the present embodiment, the second gate G2 does not belong to the patterned first conductive material layer M1, and the patterned first conductive material layer M1 includes, for instance, a first gate G1 and a shielding metal layer SM. The silicon semiconductor layer 130' at least covers a portion of the shielding metal layer SM, a portion of the first insulation layer 110 and the second insulation layer 120' is located between the silicon semiconductor layer 130' and the shielding metal layer SM, and a portion of the first insulation layer 110 is located between the second insulation layer 120' and the shielding metal layer SM.

A third insulation layer 140 is formed to cover the first source S1, the first drain D1, the second source S2, and the second drain D2. The third insulation layer 140 includes an opening H3 exposing the second source S2 and an opening H4 exposing the second drain D2.

A patterned third conductive material layer M3 is formed on the third insulation layer 140, and the third conductive material layer M3 includes, for instance, a second gate G2, a source contact structure SC, and a drain contact structure DC. The second gate G2, the source contact structure SC, and the drain contact structure DC belong to the same film layer. The source contact structure SC passes through the opening H3 to be electrically connected to the second source S2. The drain contact structure DC passes through the opening H4 to be electrically connected to the second drain D2. The second gate G2 is located above the silicon semiconductor layer 130'. In the present embodiment, the second active device T2 includes a top gate structure, and the silicon semiconductor layer 130' is located between the shielding metal layer SM and the second gate G2, but the invention is not limited thereto.

In some embodiments, the material of the third conductive material layer M3 includes a transparent conductive material such as indium tin oxide, indium zinc oxide, aluminum tin oxide, aluminum zinc oxide, indium gallium zinc oxide, other metal oxides, or a laminate of two or more of the above oxides. Since the third conductive material layer M3 includes a transparent conductive material, when the active device substrate is used in a display apparatus, a higher aperture ratio can be obtained.

In some embodiments, the shielding metal layer SM can be used as a gate, and the silicon semiconductor layer 130' is located between the second gate G2 and the shielding metal layer SM to form a dual-gate structure. Since the shielding metal layer SM and the first gate G1 are defined in the same patterning process, a dual-gate structure can be obtained without an additional patterning process. The dual-gate structure can increase the carrier mobility of the silicon semiconductor layer 130', and therefore even if the silicon semiconductor layer 130' in the second active device T2 is amorphous silicon, sufficient carrier mobility can still be achieved. Moreover, an active device having a dual-gate structure can have higher device current. In some embodiments, the shielding metal layer SM can be used as a gate, and the third conductive material layer M3 does not include the second gate G2.

FIG. 3A to FIG. 3D are cross sections of a manufacturing process of an active device substrate 3 according to an embodiment of the invention. It should be mentioned here that, the embodiment of FIG. 3A to FIG. 3C adopts the reference numerals of the embodiment of FIG. 2 and a portion of the contents thereof, wherein the same or similar numerals are used to represent the same or similar devices and descriptions of the same technical contents are omitted. The omitted portions are as described in the above embodiments and are not repeated herein.

Figure 3A:
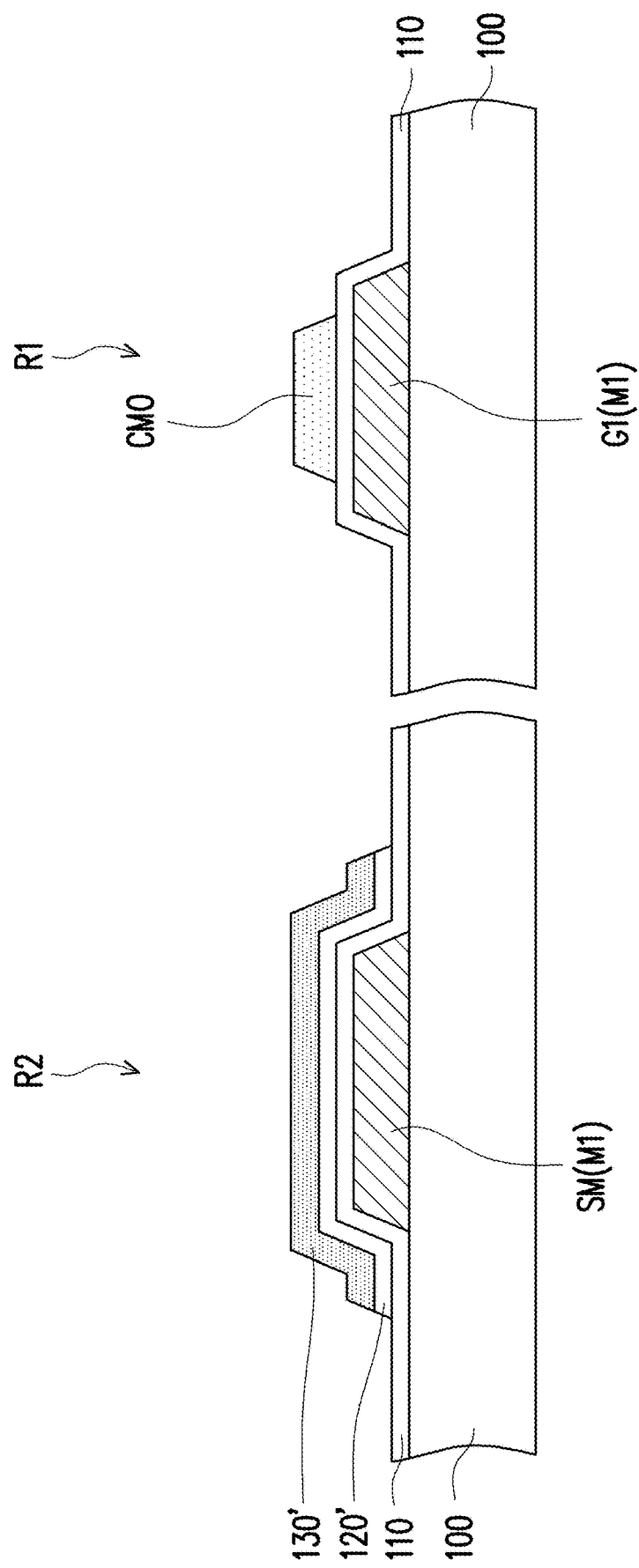
FIG. 3A to FIG. 3D are cross sections of a manufacturing process of an active device substrate according to an embodiment of the invention.

The steps before FIG. 3A are similar to FIG. 1A and FIG. 1B and are not repeated herein. In the present embodiment, the second gate G2 does not belong to the patterned first conductive material layer M1, and the patterned first conductive material layer M1 includes, for instance, a first gate G1 and a shielding metal layer SM.

Referring to FIG. 3A, a portion of the non-crystallized silicon layer 130 (shown in FIG. 1B) and the second insulation layer 120 (shown in FIG. 1B) is removed to form the silicon semiconductor layer 130' and the second insulation layer 120'. The silicon semiconductor layer 130' at least covers a portion of the shielding metal layer SM, a portion of the first insulation layer 110 and the second insulation layer 120' is located between the silicon semiconductor layer 130' and the shielding metal layer SM, and a portion of the first insulation layer 110 is located between the second insulation layer 120' and the shielding metal layer SM.

In some embodiments, before or after a portion of the non-crystallized silicon layer 130 is removed, excimer laser annealing (ELA) is performed on the non-crystallized silicon layer 130 to form the silicon semiconductor layer 130' including crystallized silicon. The silicon semiconductor layer 130' at least covers a portion of the shielding metal layer SM.

Figure 3B:
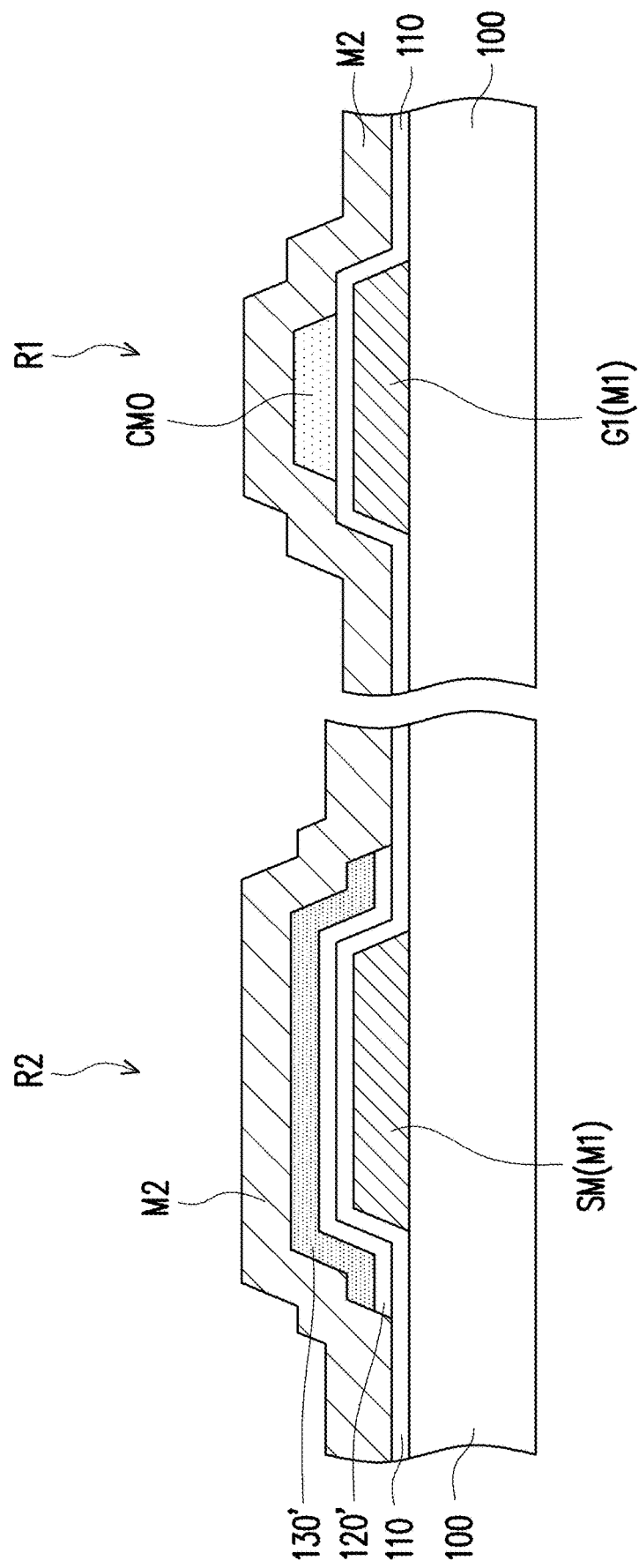

Referring to FIG. 3B, a second conductive material layer M2 is formed on the substrate 100, and the second conductive material layer M2 covers, for instance, the crystallized metal oxide layer CMO, the silicon semiconductor layer 130', the first insulation layer 110, and the second insulation layer 120'.

Figure 3C:
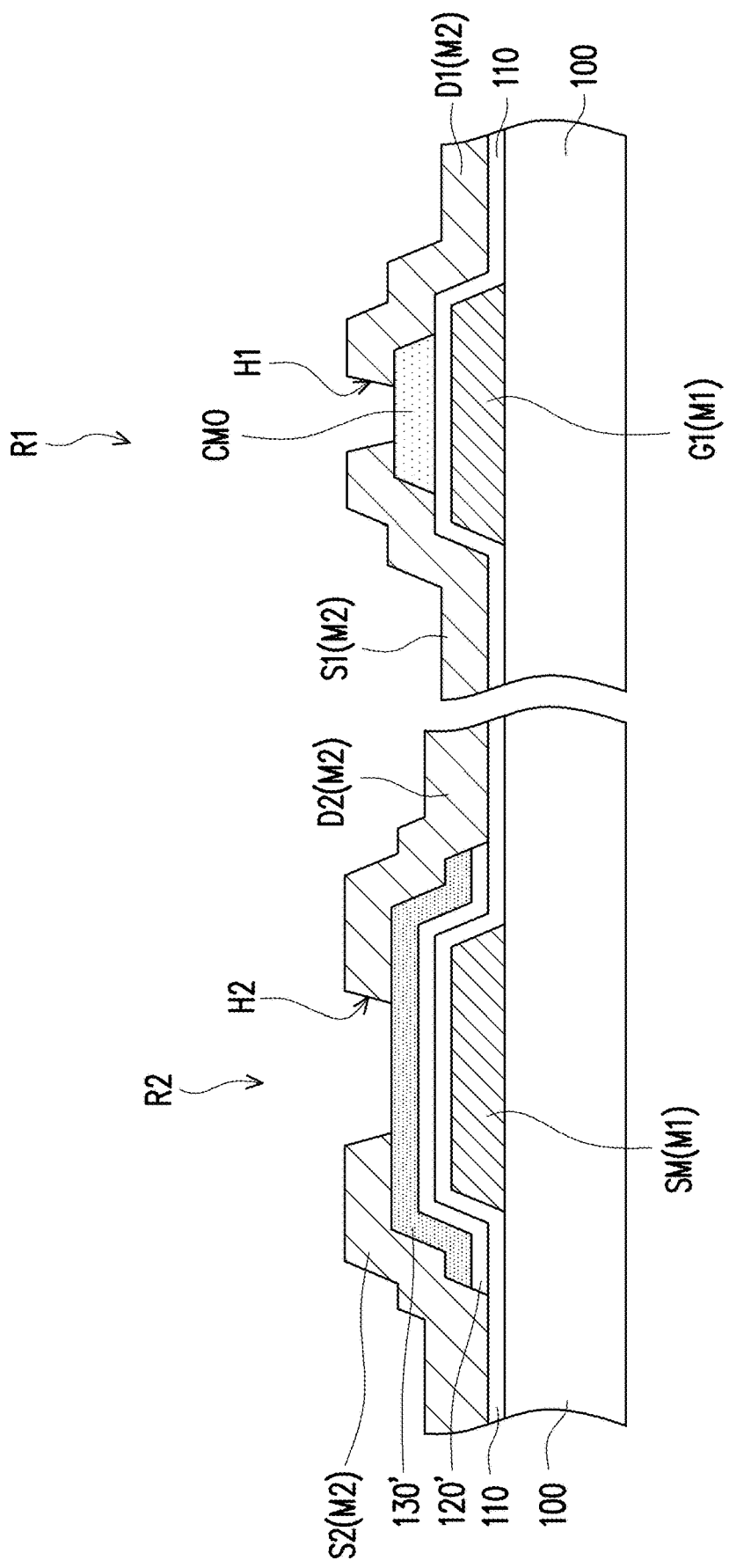

Referring to FIG. 3C, a patterning process is performed on the second conductive material layer M2 to form the first source S1, the first drain D1, the second source S2, and the second drain D2. The first source S1 and the first drain D1 are electrically connected to the crystallized metal oxide layer CMO. The second source S2 and the second drain D2 are electrically connected to the silicon semiconductor layer 130'. The method of patterning the second conductive material layer M2 includes, for instance, forming an opening H1 and an opening H2 in the second conductive material layer M2 using a wet etching method. The opening H1 separates the first source S1 and the first drain D1, and the opening H2 separates the second source S2 and the second drain D2. In some embodiments, two sides of the silicon semiconductor layer 130' is doped by n-type dopants or p-type dopants and a resistance between the silicon semiconductor layer 130' and the second source S2 and a resistance between the silicon semiconductor layer 130' and the second drain D2 can be reduced.

Figure 3D:
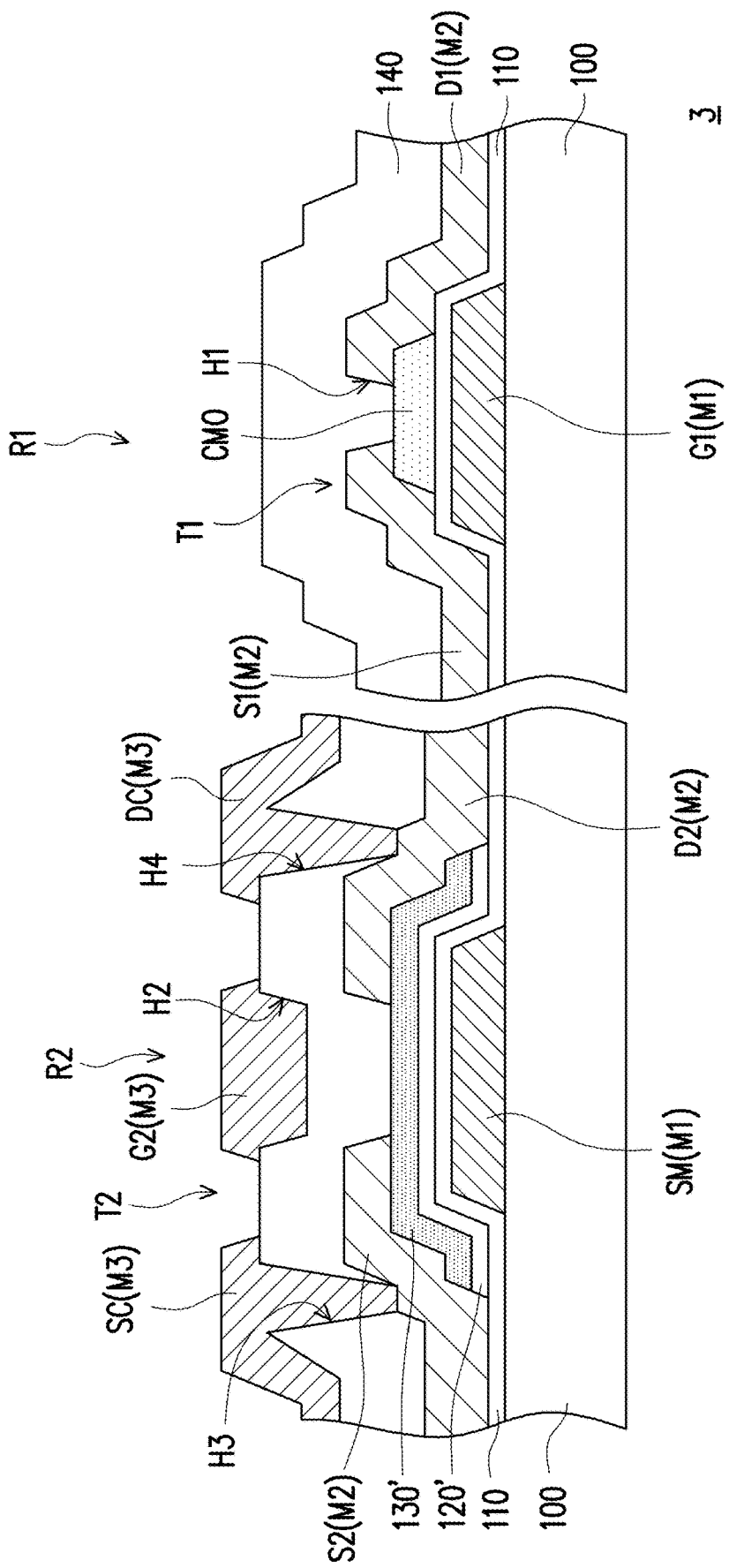

Referring to FIG. 3D, a third insulation layer 140 is formed to cover the first source S1, the first drain D1, the second source S2, and the second drain D2. The third insulation layer 140 includes an opening H3 exposing the second source S2 and an opening H4 exposing the second drain D2.

A patterned third conductive material layer M3 is formed on the third insulation layer 140, and the third conductive material layer M3 includes, for instance, a second gate G2, a source contact structure SC, and a drain contact structure DC. The second gate G2, the source contact structure SC, and the drain contact structure DC belong to the same film layer. The source contact structure SC passes through the opening H3 to be electrically connected to the second source S2. The drain contact structure DC passes through the opening H4 to be electrically connected to the second drain D2. In the present embodiment, the second active device T2 includes a top gate structure, and the silicon semiconductor layer 130' is located between the shielding metal layer SM and the second gate G2, but the invention is not limited thereto. In some embodiments, the shielding metal layer SM can be used as a gate, and the silicon semiconductor layer 130' is located between the second gate G2 and the shielding metal layer SM to form a dual-gate structure. In some embodiments, the shielding metal layer SM can be used as a gate, and the third conductive material layer M3 does not include the second gate G2.

In the present embodiment, the first drain D1 of the first active device T1 is electrically connected to a pixel electrode, and the second active device T2 is, for instance, a gate driver device in a gate-on-array (GOA). The crystallized metal oxide layer CMO of the first active device T1 has lower leakage current, and the silicon semiconductor layer 130' of the second active device T2 includes polycrystalline silicon, and therefore the active device substrate 3 of the present embodiment has advantages such as power saving and narrow border at the same time. Moreover, the first active device T1 in the present embodiment is a back channel-etched thin film transistor, and therefore the active device substrate 3 has a higher aperture ratio.

Figure 4:
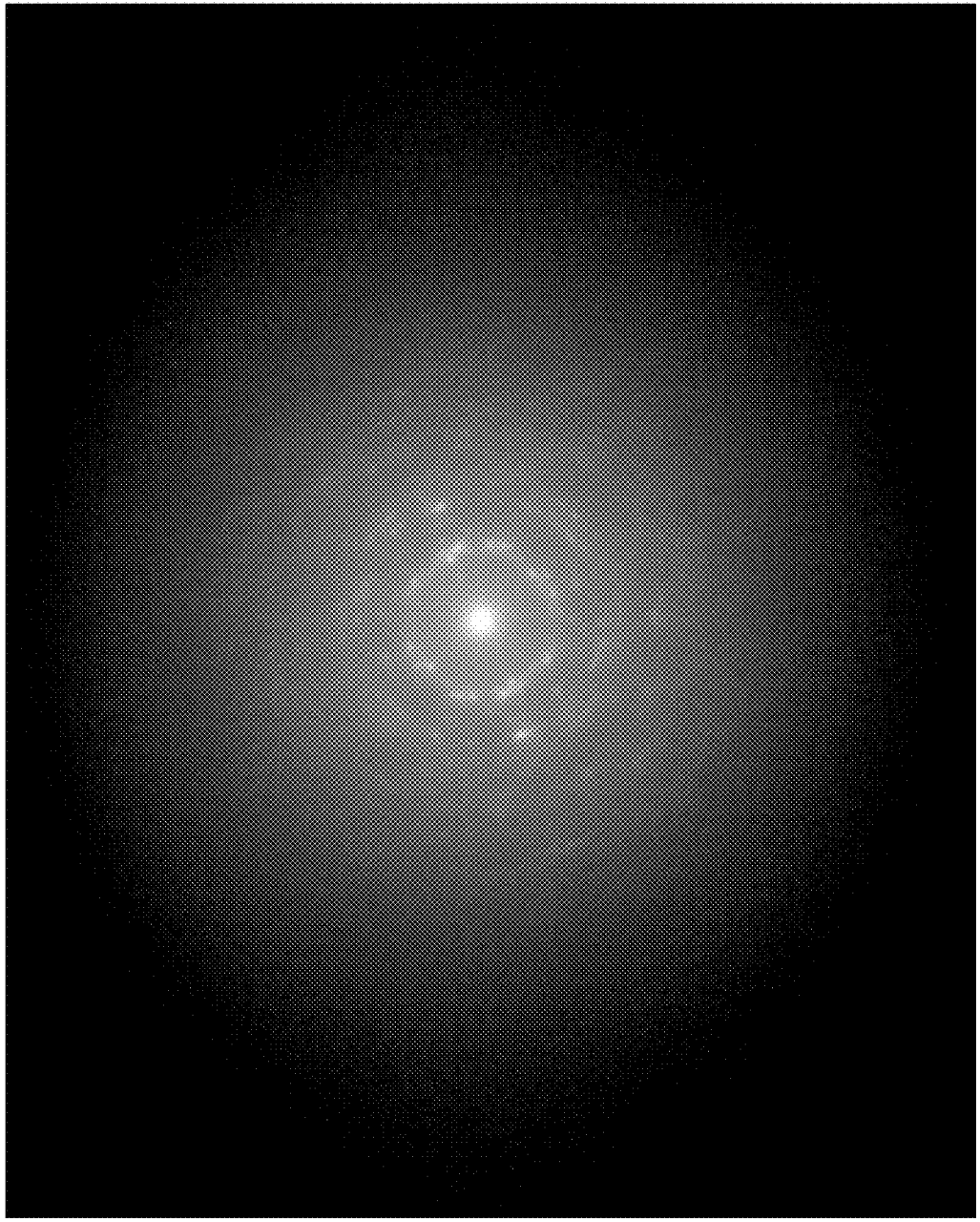
FIG. 4 is a diffraction pattern of a crystallized metal oxide layer according to an embodiment of the invention.
Figure 5:
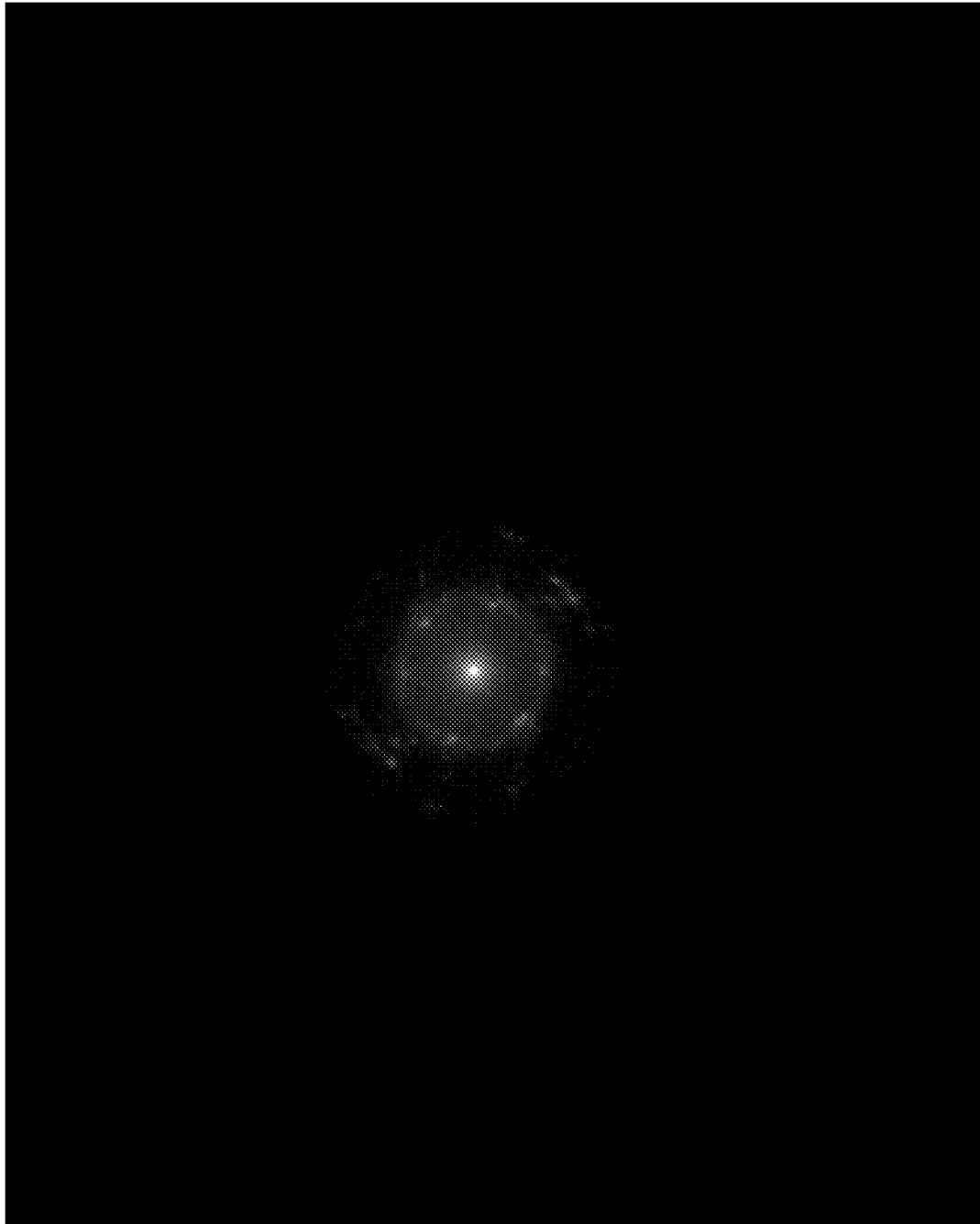
FIG. 5 is a diffraction pattern of a crystallized metal oxide layer according to an embodiment of the invention.
Figure 6:
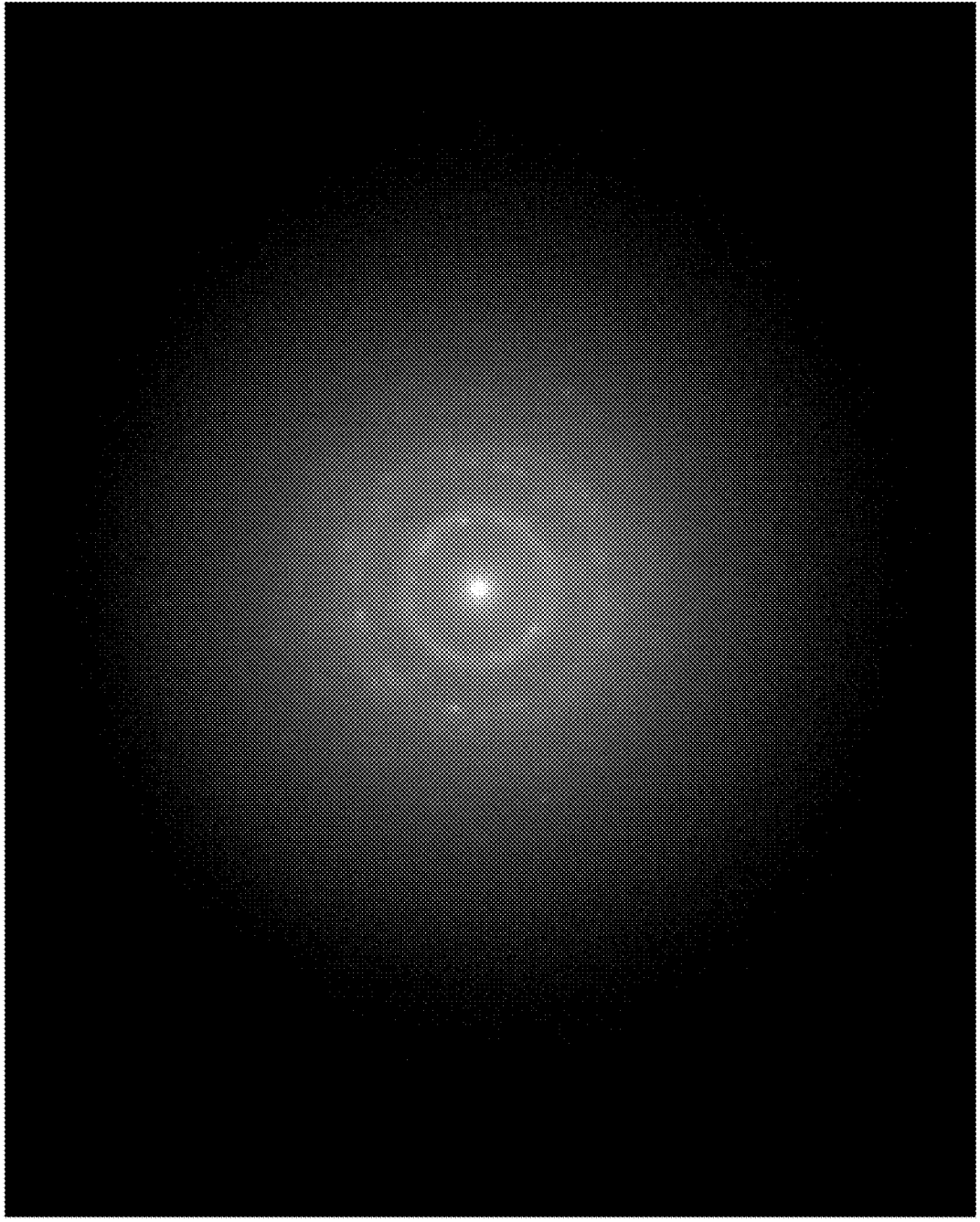
FIG. 6 is a diffraction pattern of a crystallized metal oxide layer according to an embodiment of the invention.

FIG. 4 is a diffraction pattern of a crystallized metal oxide layer according to an embodiment of the invention. FIG. 5 is a diffraction pattern of a crystallized metal oxide layer according to an embodiment of the invention. FIG. 6 is a diffraction pattern of a crystallized metal oxide layer according to an embodiment of the invention.

FIG. 4 to FIG. 6 can be diffraction patterns of a crystallized metal oxide layer in the same embodiment at different locations, and can also be diffraction patterns of a crystallized metal oxide layer in different embodiments.

Referring to FIG. 4 to FIG. 6, an area from the top surface U of the crystallized metal oxide layer CMO to the bottom surface B of the crystallized metal oxide layer CMO of some embodiments above is observed via a selected area diffraction mode of a transmission electron microscope, and a diffraction pattern of a crystallized phase can be observed, such as a diffraction pattern captured from the cross section of the crystallized metal oxide layer CMO. In FIG. 4 to FIG. 6, a plurality of obvious diffraction points can be seen in the diffraction patterns, and the diffraction points are substantially arranged in a concentric circle. In the present embodiment, the crystallized metal oxide layer CMO includes polycrystalline metal oxide such as indium gallium zinc oxide.

Figure 7A:
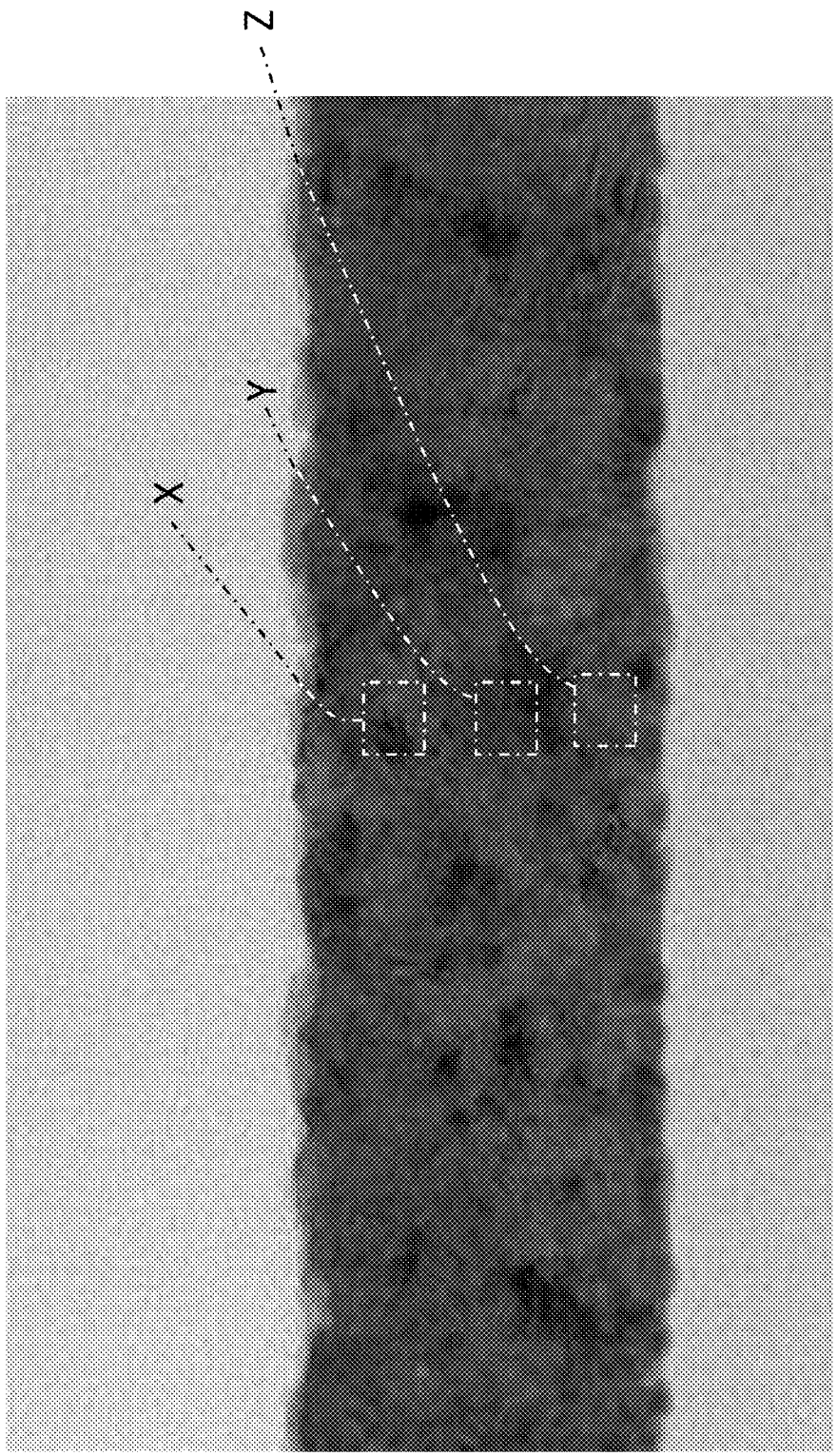
FIG. 7A is a transmission electron microscope image of a crystallized metal oxide layer according to an embodiment of the invention.
Figure 7B:
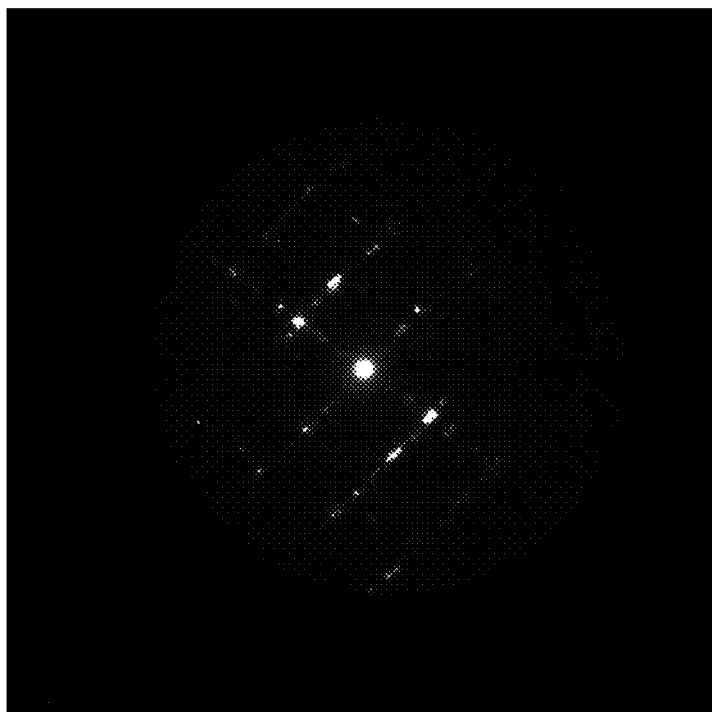
FIG. 7B to FIG. 7D are nano-beam electron diffraction (NBED) pictures of a crystallized metal oxide layer according to an embodiment of the invention.
Figure 7C:
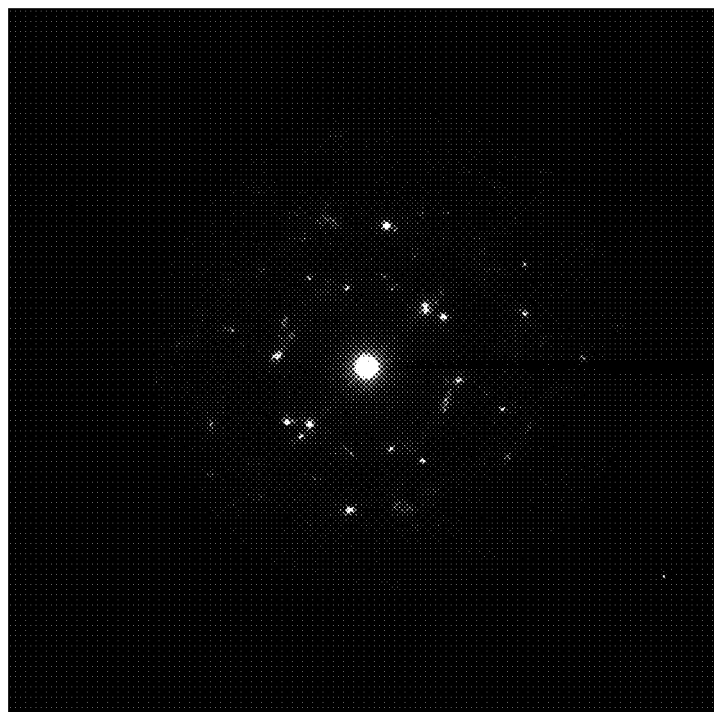
Figure 7D:
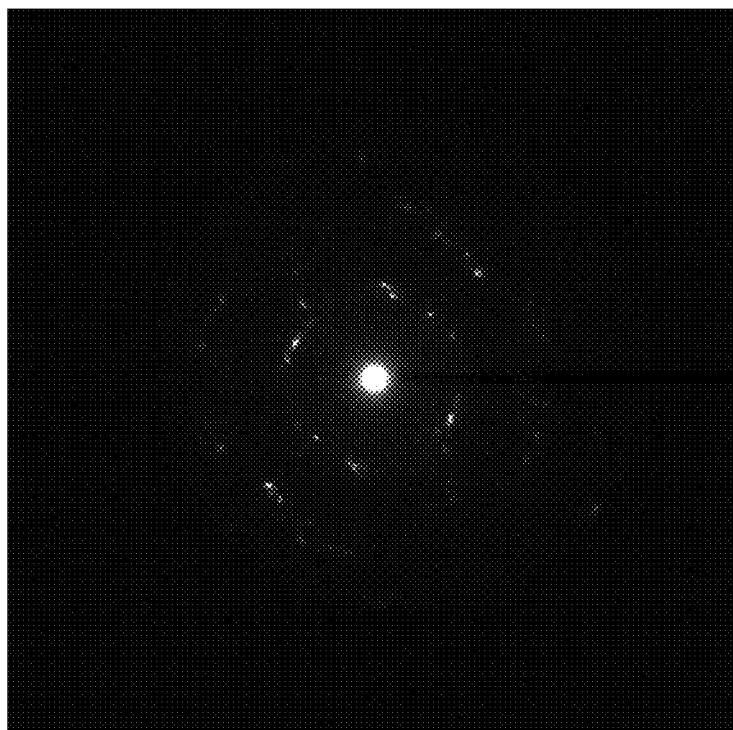

FIG. 7A is a transmission electron microscope image of a crystallized metal oxide layer according to an embodiment of the invention. FIG. 7B to FIG. 7D are nano-beam electron diffraction (NBED) pictures of a crystallized metal oxide layer according to an embodiment of the invention. FIG. 7B to FIG. 7D substantially respectively correspond to a region X, a region Y, and a region Z in FIG. 7A.

It can be seen from FIG. 7A to FIG. 7D that, crystallized metal oxide can be seen in all of the region X adjacent to the top surface, the region Y adjacent to the center, and the region Z adjacent to the bottom surface in the crystallized metal oxide layer. In the present embodiment, the metal oxide is indium gallium zinc oxide.

The first drain of the first active device in an embodiment of the invention is electrically connected to a pixel electrode, and the second active device is, for instance, a driver device of a peripheral circuit. The crystallized metal oxide layer of the first active device has lower leakage current, and the silicon semiconductor layer of the second active device includes amorphous silicon, and therefore the active device substrate has advantages such as power saving and low production cost at the same time.

The first drain of the first active device in an embodiment of the invention is electrically connected to a pixel electrode, and the second active device is, for instance, a driver device of a peripheral circuit. The crystallized metal oxide layer of the first active device has lower leakage current, and the silicon semiconductor layer of the second active device includes polycrystalline silicon, and therefore the active device substrate has advantages such as power saving and narrow border at the same time.

The first active device of an embodiment of the invention is a back channel-etched thin film transistor, and therefore the active device substrate has a higher aperture ratio.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of an active device substrate, comprising:
   forming a first gate on a substrate;
   forming a first insulation layer on the first gate;
   forming a non-crystallized metal oxide layer on the first gate;
   forming a second insulation layer on the non-crystallized metal oxide layer;
   forming a non-crystallized silicon layer on the second insulation layer, and the non-crystallized metal oxide layer is located between the non-crystallized silicon layer and the first gate;
   performing a rapid thermal annealing process to transform the non-crystallized metal oxide layer into a crystallized metal oxide layer; and
   forming a first source and a first drain electrically connected to the crystallized metal oxide layer.

2. The manufacturing method of the active device substrate of claim 1, wherein the rapid thermal annealing process has a maximum temperature of 400 degrees to 700 degrees and a duration of 30 seconds to 6 minutes.

3. The manufacturing method of the active device substrate of claim 1, further comprising:
   forming a second gate on the substrate;
   forming a silicon semiconductor layer, wherein the silicon semiconductor layer at least covers a portion of the second gate; and
   forming a second source and a second drain electrically connected to the silicon semiconductor layer.

4. The manufacturing method of the active device substrate of claim 3, wherein a method of forming the silicon semiconductor layer comprises:
   removing a portion of the non-crystallized silicon layer, wherein a remaining non-crystallized silicon layer comprises the silicon semiconductor layer.

5. The manufacturing method of the active device substrate of claim 3, wherein a method of forming the silicon semiconductor layer comprises:
   transforming the non-crystallized silicon layer into a polycrystalline silicon layer via a laser;
   removing a portion of the polycrystalline silicon layer, wherein a remaining polycrystalline silicon layer comprises the silicon semiconductor layer.

6. The manufacturing method of the active device substrate of claim 3, wherein the first gate and the second gate are formed together.

7. The manufacturing method of the active device substrate of claim 3, wherein the first insulation layer and the second insulation layer are sandwiched between the silicon semiconductor layer and the second gate.

8. The manufacturing method of the active device substrate of claim 1, wherein a material of the first insulation layer and the second insulation layer comprises silicon oxide.

9. The manufacturing method of the active device substrate of claim 1, wherein a thickness of the first insulation layer is 50 nm to 300 nm, and a thickness of the second insulation layer is 50 nm to 300 nm.

10. The manufacturing method of the active device substrate of claim 1, wherein a material of the first gate comprises titanium or a combination of titanium and aluminum.

* * * * *